United States Patent [19]

Kikuchi et al.

[11] Patent Number: 4,731,296

[45] Date of Patent: Mar. 15, 1988

[54] DIAMOND-COATED TUNGSTEN CARBIDE-BASE SINTERED HARD ALLOY MATERIAL FOR INSERT OF A CUTTING TOOL

[75] Inventors: Noribumi Kikuchi; Tetsuro Komatsu; Hiroaki Yamasita; Hironori Yoshimura, all of Ohmiya, Japan

[73] Assignee: Mitsubishi Kinzoku Kabushiki Kaisha, Tokyo, Japan

[21] Appl. No.: 66,698

[22] Filed: Jun. 24, 1987

[30] Foreign Application Priority Data

Jul. 3, 1986 [JP] Japan ................... 61-156781
Jul. 3, 1986 [JP] Japan ................... 61-156782

[51] Int. Cl.$^4$ ............................................. B22F 3/00
[52] U.S. Cl. ........................... 428/552; 29/DIG. 16; 75/240; 75/243; 76/DIG. 11; 76/DIG. 12; 125/39; 419/27; 428/408; 428/560; 428/665; 428/698; 428/908.8
[58] Field of Search ............ 428/408, 665, 698, 908.8, 428/552, 560; 76/DIG. 11, DIG. 12; 29/DIG. 16; 125/39; 75/240, 243; 419/27

[56] References Cited

U.S. PATENT DOCUMENTS

| | | | |
|---|---|---|---|
| Re. 32,093 | 3/1986 | Hale | 428/698 |
| 1,996,598 | 4/1935 | Taylor | 75/240 |
| 3,443,343 | 5/1969 | Pratt | 75/240 |
| 4,066,821 | 1/1978 | Cook et al. | 428/698 |
| 4,636,253 | 1/1987 | Nakai et al. | 75/240 |

*Primary Examiner*—Stephen J. Lechert, Jr.
*Attorney, Agent, or Firm*—Frishauf, Holtz, Goodman & Woodward

[57] ABSTRACT

A diamond-coated tungsten carbide-base sintered hard alloy material for inserts of cutting tools, which has greatly improved bond strength or degree of bonding of the diamond coating layer to the matrix and therefore is capable of exhibiting excellent cutting performance over a long period of time.

The sintered hard alloy material comprises:

(1) a matrix of a sintered hard alloy consisting essentially of 1–4 percent by weight cobalt, and the balance of tungsten carbide and inevitable impurities, the tungsten carbide having a coarse grain structure having an average grain size of 2–10 microns; and (2) a diamond coating layer formed over surfaces of the matrix by forming an etching layer over the matrix surfaces and then forming the diamond coating layer over the matrix surfaces via the etching layer by a low pressure vapor-phase synthesization method.

If required, the matrix may further contain CO1–CO8 (ISO) free carbon.

6 Claims, No Drawings

DIAMOND-COATED TUNGSTEN CARBIDE-BASE SINTERED HARD ALLOY MATERIAL FOR INSERT OF A CUTTING TOOL

BACKGROUND OF THE INVENTION

This invention relates to a diamond-coated tungsten carbide-base sintered hard alloy material for inserts of cutting tools, and more particularly to a cutting tool insert material of this kind which has greatly improved bond strength or degree of bonding of the diamond coating layer to the tungsten carbide matrix and is therefore capable of exhibiting excellent cutting performance over a long period of time.

In recent years, in development of inserts of cutting tools or the like there have been carried out many studies of the formation of diamond coating layers over surfaces of matrices formed of various materials. Conventional typical methods of forming diamond coating layers over surfaces of matrices include low pressure vapor-phase synthesization methods known as CVD Method (chemical vapor deposition method) which utilizes thermal decomposition of a gas such as $CH_4$, PVD Method (physical vapor deposition method), etc.

However, diamond coating layers formed by these low pressure vapor-phase synthesization methods generally have low bond strength, i.e. a low degree of bonding to the matrices, and therefore it has so far been impossible to utilize sintered hard alloys having such diamond coating layers as inserts of cutting tools which are subjected to high load from the work materials.

SUMMARY OF THE INVENTION

It is therefore the object of the invention to provide a diamond-coated tungsten carbide-base sintered hard alloy material for inserts of cutting tools, which has greatly improved bond strength or degree of bonding of the diamond coating layer to the matrix and therefore is capable of exhibiting excellent cutting performance over a long period of time.

According to a first embodiment of the invention, there is provided a sintered hard alloy material for an insert of a cutting tool, comprising:

(1) a matrix of a sintered hard alloy consisting essentially of 1-4 percent by weight cobalt, and the balance of tungsten carbide and inevitable impurities, the tungsten carbide having a coarse grain structure having an average grain size of 2-10 microns; and (2) a diamond coating layer formed over surfaces of the matrix by forming an etching layer over the matrix surfaces and then forming the diamond coating layer over the matrix surfaces via the etching layer by a low pressure vapor-phase synthesization method.

According to a second embodiment of the invention, there is provided a sintered hard alloy material for an insert of a cutting tool, comprising:

(1) a matrix of a sintered hard alloy consisting essentially of 1-4 percent by weight cobalt, C01-C08 (ISO) free carbon, and the balance of tungsten carbide and inevitable impurities, the tungsten carbide having a coarse grain structure having an average grain size of 2-10 microns; and (2) a diamond coating layer formed over surfaces of the matrix by forming an etching layer over the matrix surfaces and then forming the diamond coating layer over the matrix surfaces via the etching layer by a low pressure vapor-phase synthesization method.

DETAILED DESCRIPTION

The present applicants have made studies in order to obtain a tungsten carbide-base sintered hard alloy on which can be formed a diamond coating layer having high bond strength or high degree of bonding to the matrix, and which can therefore be used as a cutting tool insert. As a result, the present applicants have reached the following findings:

(a) If a low pressure vapor-phase synthesization method is applied to the surfaces of a matrix of a tungsten carbide-base sintered hard alloy, nuclei of diamond are formed only on grains of tungsten carbide (hereinafter abbreviated as "WC") on the matrix surfaces, but part of the diamond can be graphitized on grains of cobalt (Co);

(b) Therefore, it is desirable that the content of Co as a combined phase-forming component in the matrix should be as small as possible. However, if the Co content is too small or less than 1 percent by weight, it will result in reduced strength of the alloy. Therefore, if the Co content is within a range from 1 to 4 percent by weight, the diamond coating layer of the resulting alloy material can have high bond strength and accordingly the alloy material can have sufficient strength for use as a cutting tool;

(c) If WC in the WC-base sintered hard alloy has a coarse grain structure having an average grain size of 2-10 microns, the speed at which the diamond coating layer is formed increases and also the bond strength of the resulting diamond coating layer increases;

(d) If a small amount, preferably C01-C08 (ISO=International Standardization Organization) more preferably C01-C04, free carbon having a fine grain size, is evenly dispersed throughout the matrix of the WC-base sintered hard alloy, the diamond cannot easily be graphitized and the resulting diamond coating layer cannot easily be exfoliated from the matrix;

(e) Further, if the surfaces of the matrix of the WC-base sintered hard alloy are etched to remove Co as the combined phase-forming component therefrom and form an etching layer which is free of Co, preferably having a mean layer thickness of 0.1-1 micron, and then the diamond layer is formed over the matrix surfaces via the etching layer, the bond strength or degree of bonding of the diamond coating layer to the matrix further increases.

The present invention is based upon the above findings (a) to (e).

Diamond-coated WC-base sintered hard alloy materials for inserts of cutting tools (hereinafter abbreviated as "coated cutting inserts") according to the invention have the aforestated chemical compositions and structures.

In coated cutting inserts according to the invention, the Co content is limited within a range from 1 to 4 percent by weight. That is, if the Co content is less than 1 percent by weight, the matrix cannot have sufficient strength required for use as a cutting tool insert. However, if the Co content exceeds 4 percent by weight, the speed of formation of the diamond coating layer decreases, and also part of the diamond can become graphitized, making it impossible to secure desired excellent wear resistance and bond strength. In the coated cutting inserts according to the invention, WC having a coarse grain llze is employed which has an average grain size of 2-10 microns. That is, if the average grain size is less than 2 microns, the speed of formation of the diamond coating layer can greatly decrease and also the bond strength can become degraded. On the other hand, in actuality it is difficult to manufacture a WC-base sintered hard alloy by using WC having an average grain size exceeding 10 microns. Therefore, the average grain size of WC has been limited within a range from 2 to 10 microns, and preferably within a range from 2 to 5 microns.

The etching layer is formed by dipping the matrix in an aqueous solution of a strong acid of concentration of from 1 to 10 percent selected from the group consisting of nitric acid, hydrochloric acid, and sulfuric acid, for a period of time within a range from 1 to 30 minutes.

Examples of the coated cutting inserts according to the invention will now be described in detail.

EXAMPLE I

As starting powders, various WC powders having respective predetermined average grain sizes falling within a range from 2 to 10 microns, and Co powder having an average grain size of 1.2 microns were prepared. These starting powders were blended into respective predetermined compositions. Thereafter, in conventional ordinary manners, each of the blended powders was mixed, the mixed powder was compacted, and the green compact was sintered at a temperature within a range from 1430° to 1500° C. The sintered compacts were subjected to grinding to obtain throwaway inserts as WC-base sintered hard alloy matrices having a shape according to SPP 432 of CIS (Cemented Carbide Tool Industrial Standard) and compositions, average grain sizes of WC, and values of Rockwell hardness (A scale), which are shown in Table 1. These throwaway inserts were subjected to etching under conditions shown in Table 1 to form an etching layer over the surfaces of each throwaway insert. Then, the throwaway inserts each had their surfaces coated with diamond under the following conditions by CVD Method:

Reaction Vessel: Quartz tube with a diameter of 120 mm;
Filament: Metal W;
Matrix Temperature: 700° C.;
Atmosphere: CH+$H_2$ under 10 torr;
Ratio of Reaction
Gas Components: $CH_4/H_2$=0.005;
Reaction Time: 3-6 hours.

Thus, coated cutting inserts Nos. 1-7 according to the present invention and comparative coated cutting inserts Nos. 1-3 were prepared which have mean layer thicknesses shown in Table 1.

The comparative coated cutting inserts Nos. 1-3 each have one or more of powder composition of the matrix and average grain size of WC falling outside the scope of the present invention.

TABLE 1

| SPECIMEN | MATRIX COMPOSITION Co (WT %) | MATRIX COMPOSITION WC + IMPURITIES | AVERAGE GRAIN SIZE OF WC (μm) | HARDNESS (H$_R$A) | ETCHING REAGENT | DIPPING TIME (MIN.) | MEAN LAYER THICKNESS OF ETCHING LAYER (μm) | MEAN LAYER THICKNESS OF DIAMOND COATING LAYER (μm) | EXFOLIATION OF DIAMOND COATING LAYER | DEPOSITION OF WORK MATERIAL | WEAR STATE OF CUTTING EDGE | WEAR AMOUNT OF CUTTING EDGE (μm) |
|---|---|---|---|---|---|---|---|---|---|---|---|---|
| COATED CUTTING INSERTS ACCORDING TO PRESENT INVENTION | | | | | | | | | | | | |
| 1 | 1.5 | bal. | 3.7 | 90.5 | 5% NITRIC ACID | 5 | 0.2 | 3.6 | NIL | NIL | NORMALLY WORN | 0.05 |
| 2 | 2.5 | " | 3.2 | 90.4 | " | 15 | 0.4 | 3.7 | " | " | NORMALLY WORN | 0.06 |
| 3 | 3.0 | " | 2.3 | 91.0 | " | 5 | 0.2 | 3.0 | " | " | NORMALLY WORN | 0.06 |
| 4 | 3.0 | " | 4.7 | 90.1 | " | 30 | 0.5 | 3.4 | " | " | NORMALLY WORN | 0.06 |
| 5 | 3.0 | " | 6.5 | 89.7 | 5% HYDROCHLORIC ACID | 10 | 0.15 | 3.5 | " | " | NORMALLY WORN | 0.05 |
| 6 | 3.0 | " | 8.8 | 89.2 | " | 15 | 0.2 | 3.8 | " | " | NORMALLY WORN | 0.07 |
| 7 | 4.0 | " | 6.0 | 89.9 | 3% SULFURIC ACID | 5 | 0.1 | 3.5 | " | " | NORMALLY WORN | 0.06 |
| COMPARATIVE COATED CUTTING INSERTS | | | | | | | | | | | | |
| 1 | 0.8* | " | 3.5 | 90.6 | 5% NITRIC ACID | 5 | 0.2 | 3.0 | PRESENT | PRESENT | CHIPPED AFTER 3 MIN | |
| 2 | 3.5 | " | 1.2* | 91.0 | " | 15 | 0.4 | 3.0 | PRESENT AT CHIPPED PORTION | " | ABNORMALLY WORN DUE TO CHIPPING | 0.48 |
| 3 | 5.2* | " | 4.0 | 89.1 | " | 5 | 0.2 | 3.2 | PRESENT | " | HEAVILY WORN AND RECESSED | 0.50 |

*falls outside the range of the present invention

The coated cutting inserts Nos. 1–7 according to the invention and the comparative coated cutting inserts Nos. 1–3 were subjected to a cutting test by the use of a milling cutter under the following conditions:
Work Material: Al-18 wt% Si Alloy;
Cutter Diameter: Double Positive Type with a diameter of 160 mm;
Cutting Speed: 520 m per minute;
Feed rate: 0.18 mm per rev.;
Depth of Cut: 1.5 mm;
Cutting Time: 80 minutes.

After cutting under the above conditions, the state of exfoliation of the diamond coating layer of the coated cutting insert, the state of deposition of the work material on the coated cutting insert and the state of wear of the cutting edge, as well as the wear amount of the coated cutting insert were examined, results of which are shown in Table 1.

It will be learned from Table 1 that all of the coating cutting inserts Nos. 1–7 according to the present invention are almost free of exfoliation of the diamond coating layer from the matrix as well as deposition of the work material on the coated cutting insert, show normal states of wear of the cutting edge, and exhibit excellent wear resistance, by virtue of their high speed of formation of the diamond coating layer and very high bond strength or degree of bonding of the diamond coating layer to the matrix. On the other hand, the comparative coated cutting inserts Nos. 1–3, all of which have one or more of the matrix powder composition and average grain size of WC falling outside the range of the present invention show unsatisfactory results in respect of all of the work material and state of wear of the cutting edge, as well as the wear amount of the cutting edge and further exhibit unsatifactory wear resistance, owing to their low speed of formation of the diamond coating layer and inferior bond strength.

EXAMPLE II

As starting powders, various WC powders having respective predetermined average grain sizes falling within a range from 2 to 10 microns, Co powder having an average grain size of 1.2 microns, and carbon black having a fine grain size were prepared. These starting powders were blended into respective predetermined compositions. Thereafter, mixing, compacting, sintering and grinding were carried out under the same conditions as in Example I to obtain throwaway inserts as WC-base sintered hard alloy matrices having a shape according to SPP 422 of CIS and compositions, average grain sizes of WC, and values of Rockwell hardness (A scale), which are shown in Table 2. The free carbon or carbon black contents are shown in a unit according to CIS Standard. These throwaway inserts were subjected to etching under conditions shown in Table 2 to form an etching layer over the surfaces of each throaway insert. Then, the throwaway inserts each had their surfaces coated with diamond by CVD Method under the same coating conditions as in Example I. Thus, coated cutting inserts Nos. 8–14 and comparative coated cutting inserts Nos. 4–6 were prepared which have mean layer thicknesses shown in Table 2.

TABLE 2

| SPECIMEN | MATRIX COMPOSITION Co (WT %) | FREE CARBON | WC + IMPURITIES | AVERAGE GRAIN SIZE OF WC (μm) | HARDNESS ($H_RA$) | ETCHING CONDITIONS ETCHING REAGENT | DIPPING TIME (MIN.) | MEAN LAYER THICKNESS OF ETCHING LAYER (μm) | MEAN LAYER THICKNESS OF DIAMOND COATING LAYER (μm) | EXFOLIATION OF DIAMOND COATING LAYER | DEPOSITION OF WORK MATERIAL | WEAR STATE OF CUTTING EDGE | WEAR AMOUNT OF CUTTING EDGE (μm) |
|---|---|---|---|---|---|---|---|---|---|---|---|---|---|
| COATED CUTTING INSERTS ACCORDING TO PRESENT INVENTION | | | | | | | | | | | | | |
| 8 | 1.3 | C08 | bal. | 3.8 | 90.4 | 5% NITRIC ACID | 5 | 0.20 | 3.6 | NIL | NIL | NORMALLY WORN | 0.03 |
| 9 | 2.6 | C08 | " | 3.3 | 90.3 | | 15 | 0.40 | 3.7 | " | " | NORMALLY WORN | 0.07 |
| 10 | 3.0 | C04 | " | 2.2 | 91.1 | | 5 | 0.20 | 3.3 | " | " | NORMALLY WORN | 0.07 |
| 11 | 3.0 | C06 | " | 4.7 | 90.1 | | 30 | 0.60 | 3.5 | " | " | NORMALLY WORN | 0.04 |
| 12 | 3.0 | C04 | " | 6.6 | 89.7 | 5% HYDROCHLORIC ACID | 10 | 0.18 | 3.8 | " | " | NORMALLY WORN | 0.05 |
| 13 | 3.0 | C04 | " | 9.0 | 89.0 | | 15 | 0.30 | 3.9 | " | " | NORMALLY WORN | 0.05 |
| 14 | 3.9 | C02 | " | 5.3 | 89.4 | 3% SULFURIC ACID | 5 | 0.15 | 3.3 | " | " | NORMALLY WORN | 0.06 |
| COMPARATIVE COATED CUTTING INSERTS | | | | | | | | | | | | | |
| 4 | 0.7* | C02 | " | 4.0 | 90.5 | 5% NITRIC ACID | 5 | 0.20 | 2.8 | " | PRESENT | CHIPPED AFTER 7 MIN. | |
| 5 | 5.0 | C06 | " | 1.7* | 91.3 | | 15 | 0.40 | 2.9 | " | " | ABNORMALLY WORN DUE TO CHIPPING | 0.50 |
| 6 | 5.4* | —* | " | 4.4 | 89.9 | | 5 | 0.20 | 2.8 | " | " | HEAVILY WORN AND RECESSED | 0.52 |

*falls outside the range of the present invention

The comparative coated cutting inserts Nos. 4-6 each have one or more of powder composition of the matrix and average grain size of WC falling outside the range of the present invention.

The coated cutting inserts Nos. 8-14 according to the invention and the comparative coated cutting inserts Nos. 4-6 were subjected to a cutting test by the use of a milling cutter under the following conditions:

Work Material: Al-16 wt% Si Alloy;
Cutter Diameter: Double Positive Type with a diameter of 160 mm;
Cutting Speed: 570 m per minute;
Feed rate: 0.19 mm per rev.;
Depth of Cut: 1 mm;
Cutting Time: 70 minutes.

After cutting under the box conditions, the state of exfoliation of the diamond-coated layer of the coated cutting insert, the state of deposition of the work material on the coated cutting insert and the state of wear of the cutting edge, as well as the wear amount of the cutting edge were examined, results of which are shown in Table 2.

It will be learned from Table 2 that all of the coated cutting inserts Nos. 8-14 according to the present invention are superior to the comparative coated cutting inserts Nos. 4-6 in respect of all of the state of exfoliation of the diamond-coated layer of the coated cutting insert, the state of deposition of the work material on the coated cutting insert and the state of wear of the cutting edge, as well as the wear resistance.

What is claimed is:

1. A sintered hard alloy material for an insert of a cutting tool, comprising:
   (1) a matrix of a sintered hard alloy consisting essentially of 1-4 percent by weight cobalt, and the balance of tungsten carbide and inevitable impurities, the tungsten carbide having a coarse grain structure having an average grain size of 2-10 microns; and
   (2) a diamond coating layer formed over surfaces of the matrix by forming an etching layer over the matrix surfaces and then forming the diamond coating layer over the matrix surfaces via the etching layer by a low pressure vapor-phase synthesization method.

2. A sintered hard alloy material as claimed in claim 1, wherein said etching layer has a mean layer thickness of 0.1-1 micron.

3. A sintered hard alloy material as claimed in claim 1, wherein said etching layer is formed by dipping the matrix in an aqueous solution of a strong acid of concentration of 1-10 percent selected from the group consisting of nitric acid, hydrochloric acid, and sulfuric acid, for a period of time within a range from 1 to 30 minutes.

4. A sintered hard alloy material for an insert of a cutting tool, comprising:
   (1) a matrix of a sintered hard alloy consisting essentially of 1-4 percent by weight cobalt, CO1-CO8 free carbon, and the balance of tungsten carbide and inevitable impurities, the tungsten carbide having a coarse grain structure having an average grain size of 2-10 microns; and
   (2) a diamond coating layer formed over surfaces of the matrix by forming an etching layer over the matrix surfaces and then forming the diamond coating layer over the matrix surfaces via the etching layer by a low pressure vapor-phase synthesization method.

5. A sintered hard alloy material as claimed in claim 4, wherein said etching layer has a mean layer thickness of 0.1-1 micron.

6. A sintered hard alloy material as claimed in claim 4, wherein said etching layer is formed by dipping the matrix in an aqueous solution of a strong acid of concentration of 1-10 percent selected from the group consisting of nitric acid, hydrochloric acid, and sulfuric acid, for a period of time within a range from 1 to 30 minutes.

* * * * *